United States Patent
Sasaki

Patent No.: US 6,331,827 B1
Date of Patent: Dec. 18, 2001

(54) HUFFMAN DECODER USING TWO PRIORITY ENCODER TO REDUCE CIRCUIT SCALE

(75) Inventor: Tsuneki Sasaki, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/598,253

(22) Filed: Jun. 21, 2000

(30) Foreign Application Priority Data

Jun. 29, 1999 (JP) .................................................. 11-183286

(51) Int. Cl.[7] ...................................................... H03M 7/40
(52) U.S. Cl. ................................................. 341/65; 341/67
(58) Field of Search .................................. 341/65, 67, 63; 358/426, 427, 432; 382/246, 248; 375/240

(56) References Cited

U.S. PATENT DOCUMENTS 5,801,650 * 9/1998 Nakayama .............................. 341/67
5,805,737 * 9/1998 Abe ....................................... 382/246

FOREIGN PATENT DOCUMENTS 6-276394   3/1994   (JP).
6-276101   9/1994   (JP).
7-303045  11/1995   (JP).

* cited by examiner

Primary Examiner—Patrick Wamsley
(74) Attorney, Agent, or Firm—McGuireWoods LLP

(57) ABSTRACT

A Huffman-code decoder includes a coded data storage section, a code length detector for detecting the code length of an input Huffman code, an address calculator for calculating the address for the coded data for the input Huffman code, a value data storage section for storing a value data obtained by subtracting from the minimum code the address thereof, and a subtracter for subtracting the value data from the input Huffman code. Each of the value data storage section, subtracter and code length detector has a maximum of eight bits for the Huffman codes having a single to sixteen bits.

3 Claims, 5 Drawing Sheets

HUFFMAN DECODER USING TWO PRIORITY ENCODER TO REDUCE CIRCUIT SCALE

BACKGROUND OF THE INVENTION (a) Field of the Invention

The present invention relates to a Huffman-code decoder having a reduced circuit scale and, more particularly, to a technique for decoding a Huffman code data obtained by coding and compressing color still picture data based International Standard "JPEG" (Joint Photographic Experts Group) defined in ISO/IEC10198-1, or color motion picture data based on International Standard "MPEG1" (Motion Picture Image Coding Experts Group 1) defined in ISO/IEC11172-2, or International Standard "MPEG2" (Motion Picture Image Coding Experts Group II) defined in ISO/IEC13818-2, or International Standard "Digital Video (DV)" defined in IEC61834-2.

(b) Description of a Related Art

Picture data generally includes a large amount of information, and is processed by using a data compression technique. The data compression techniques available now include JPEG, MPEG1, MPEG2 and DV, wherein the picture data is compressed by using a series of Huffman codes as an international standard.

Each of the Huffman codes has a single bit (D0), two bits (D0, D1), three bits (D0, D1, D2), or sixteen bits (D0, D1 . . . D15) depending on the original picture data, wherein bit D0 is the most significant bit and bit D15 is the least significant bit in the Huffman code having sixteen bits. Huffman codes having a specified number of bits (or specified code length) ranges between a maximum code (M1, M2 . . . M16) and a minimum code for the specified code length.

Several techniques are proposed for reducing the circuit scale for the decoders used for decoding the Huffman codes to obtain decoded data. FIG. 1 shows a conventional Huffman-code decoder, described in JP-A-6-276104. The Huffman-code decoder includes a plurality of discrete circuits 311 to 31n each corresponding to one of Huffman codes and including a coding filter 301, Huffman-code register 302 and a coincidence detector 303. One of the discrete circuits 311 to 31n responds to the input Huffman code to output a decoded address for the input Huffman code, whereby a decoded output is delivered from the Huffman table 320 based on the decoded address.

In the conventional Huffman-code decoder of FIG. 1, the number of discrete circuits 311 to 31n provided for respective Huffman codes is large and thus increases the circuit scale of the Huffman-code decoder.

FIG. 2 shows another Huffman-code decoder described in JP-A-6-276394, including a code length detector 431 for detecting the code length of the input Huffman code and a code detector 432 for detecting a coded data among the coded data stored therein based on the code length supplied from the code length detector 431. In the code length detector 431, each of 8-bit comparator 411, 9-bit comparator 412, and 16-bit comparator 419 compares the input Huffman code in the compressed data against the maximum code M8, M9, or M16 of the Huffman code having a corresponding code length. A priority encoder 410 detects the code length based on the results of comparison in the comparators 411 to 419. In the coded data detector 432, each 256-word RAM 421 to 429 receives corresponding eight bits among the whole bits of the input Huffman code as an address signal to output the stored coded data as an intermediate data. A data selector 420 selects one of the intermediate data output from the 256-word RAMs based on the code length supplied from the code length detector 431.

In the Huffman-code decoder of FIG. 2, most 256-word RAMs for storing the decoded data have redundant memory cells wherein data are not stored due to less number of bits, which raises the capacity of the RAMs. This also raises the circuit scale of the decoder. In addition, since the code length detector 431 includes only 8-bit comparator 411 to 16-bit comparator 419, the code length detection is separately conducted for first bit to seventh bits and then for eighth bit to sixteen bit for the input Huffman code, which detection consumes a large processing time.

FIG. 3 shows another conventional Huffman-code decoder, described in JP-A-7-303045. The Huffman-code decoder includes an address calculator 554 for outputting intermediate data, a code length detector 553 for outputting the code length of the input Huffman code, an address selector 552 for selecting one of the intermediate data and a memory 551 for storing decoded data in a plurality of memory cells. The address calculator 554 includes a plurality of value data storage sections 521 to 536 each for storing the minimum code for each code length and a corresponding number of bit adders 501 to 516 including 1-bit adder 501, 2-bit adder, and 16-bit adder 516, which output respective intermediate data. The address selector 552 selects one of the intermediate data based on the code length detected by the code length detector 553, thereby outputting a decoded address, based on which the memory 551 outputs a decoded data.

In the Huffman-code decoder of FIG. 3, the address calculator 554 includes adders 501 to 516 each having a number of bits corresponding to the code length of the Huffman codes, and the code length detector 553 also has therein comparators each having a number of bits corresponding to the code length of the Huffman codes. This increases the circuit scale of the Huffman-code decoder.

SUMMARY OF THE INVENTION

In view of the above, it is an object of the present invention to provide a Huffman-code decoder having a reduced circuit scale and capable of decoding the Huffman code at a high speed.

The present invention provides a Huffman-code decoder including: a coded data memory for storing coded data for possible Huffman codes, the coded data having addresses defined by sequential numbers of the Huffman codes, a number of the possible Huffman codes being equal to or less than $2^N$, the possible Huffman codes having M bits at most; a maximum code data storage section including a plurality of memory cells each for storing a maximum code data; a value data storage section including a plurality of memories each for storing value data corresponding to minimum code among Huffman codes having a corresponding number of bits; a code length detector for detecting a code length of an input Huffman code by comparing the input Huffman code against the maximum code data; a first selection section for selecting all bits of the input Huffman codes having (N−1) bits or less and (n−N+1)th bit to n-th bit of the input Huffman code having N bits or more based on the code length detected by the code length detector, "n" being a natural number assuming N to M; a second selection section for selecting one of maximum code data, stored in the maximum code data storage section, based on the code length detected by the code length detector; and an address calculator for calculating an address based on the selected bits of the input Huffman code and the selected value data to specify the coded data in the coded data storage section based on the calculated address, each the value data corresponding to a remainder obtained by subtracting the address of a minimum code among Huffman codes having a corresponding number of bits in the coded data storage section from minimum code data.

The minimum code data corresponds to the minimum code among Huffman codes having (N−1) bits or less and corresponds to (n-N+1)th bit to n-th bit of a minimum code among Huffman codes having N bits or more.

In accordance with the Huffman-code decoder of the present invention, since the value data stored in the value data storage section has N bits or less, the capacity of the value data storage section is reduced compared to the conventional decoder.

The above and other objects, features and advantages of the present invention will be more apparent from the following description, referring to the accompanying drawings.

PREFERRED EMBODIMENT OF THE INVENTION

Now, the present invention is more specifically described with reference to accompanying drawings.

Figure 1:
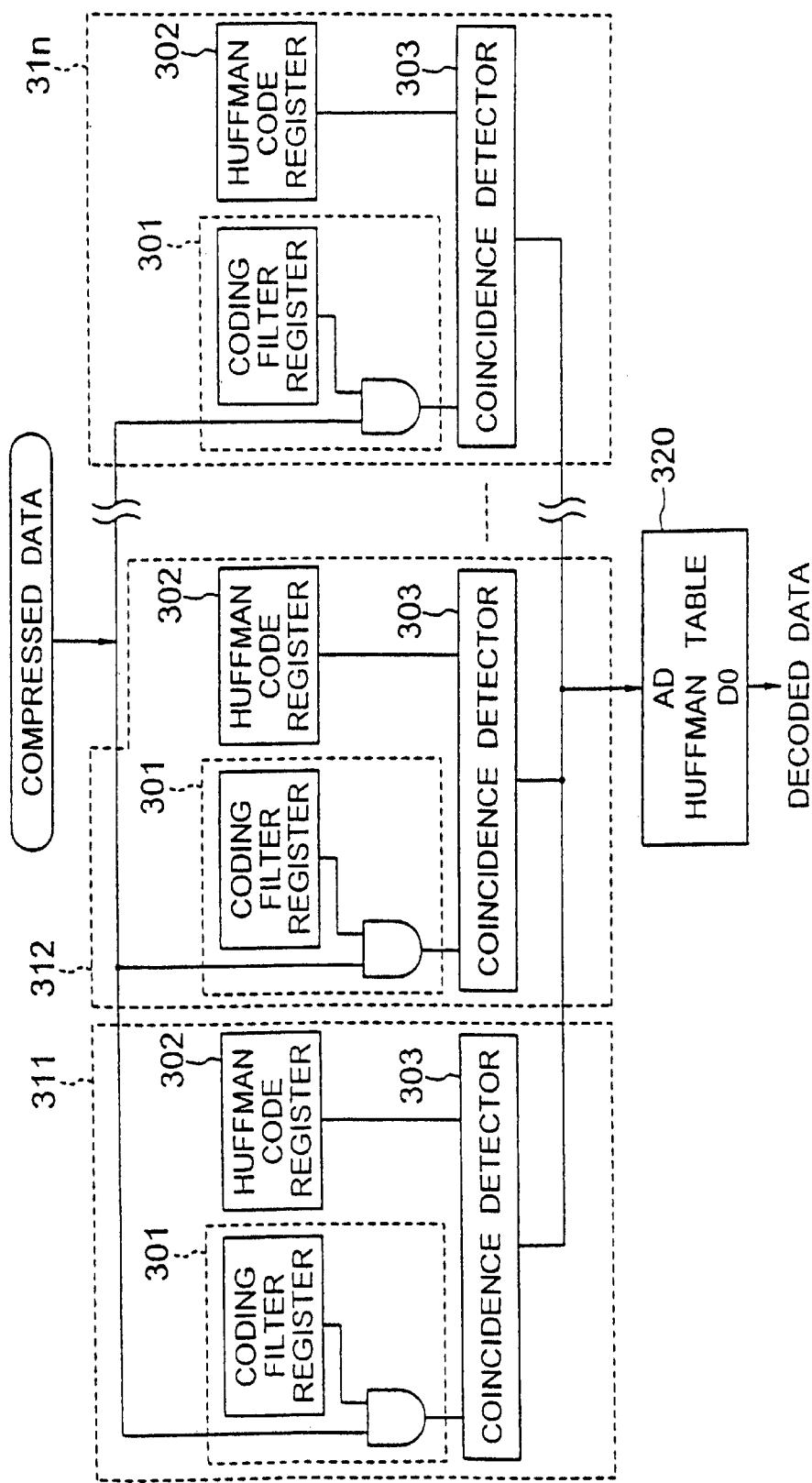
FIG. 1 is a block diagram of a conventional Huffman-code decoder.
Figure 2:
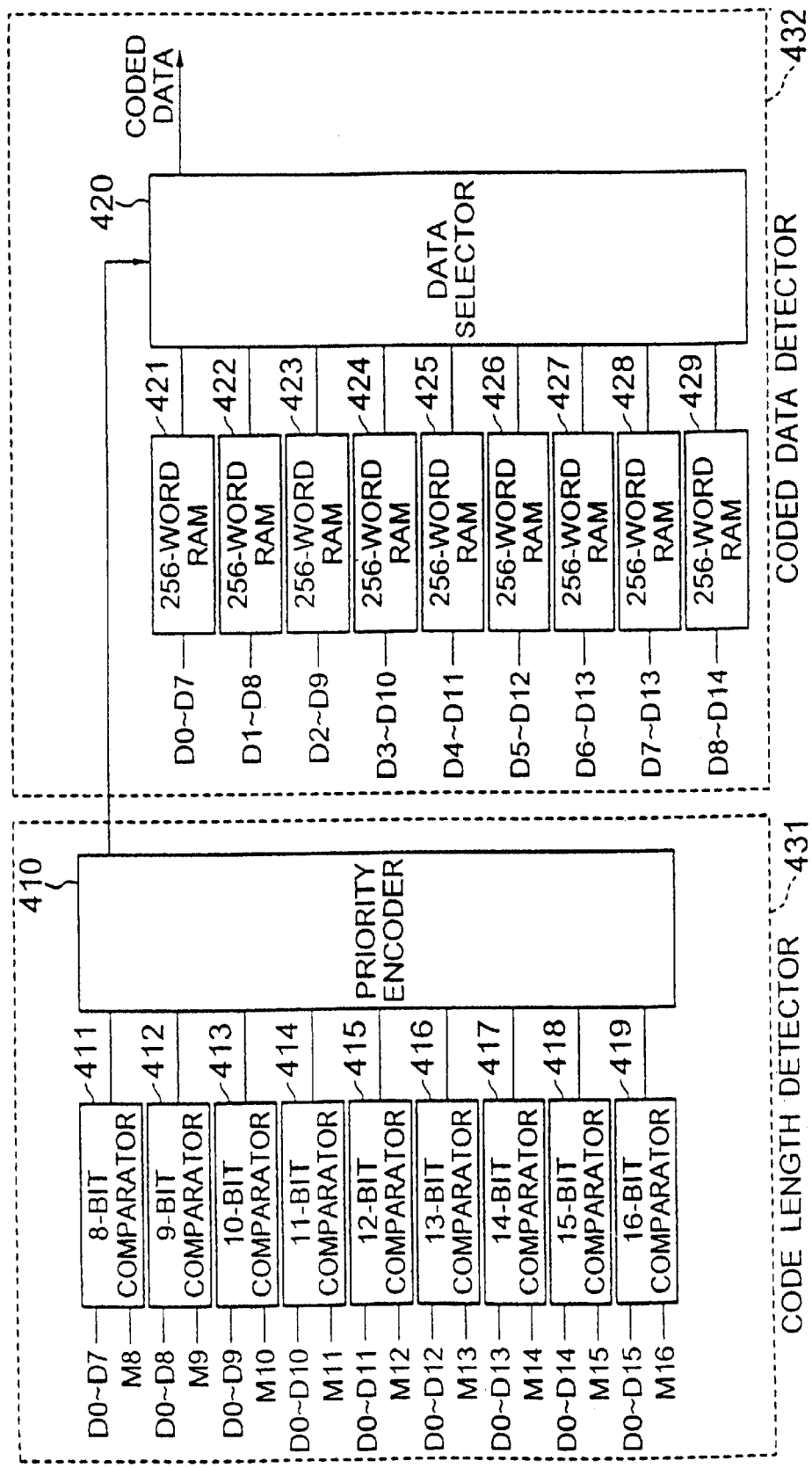
FIG. 2 is a block diagram of another conventional Huffman-code decoder.
Figure 3:
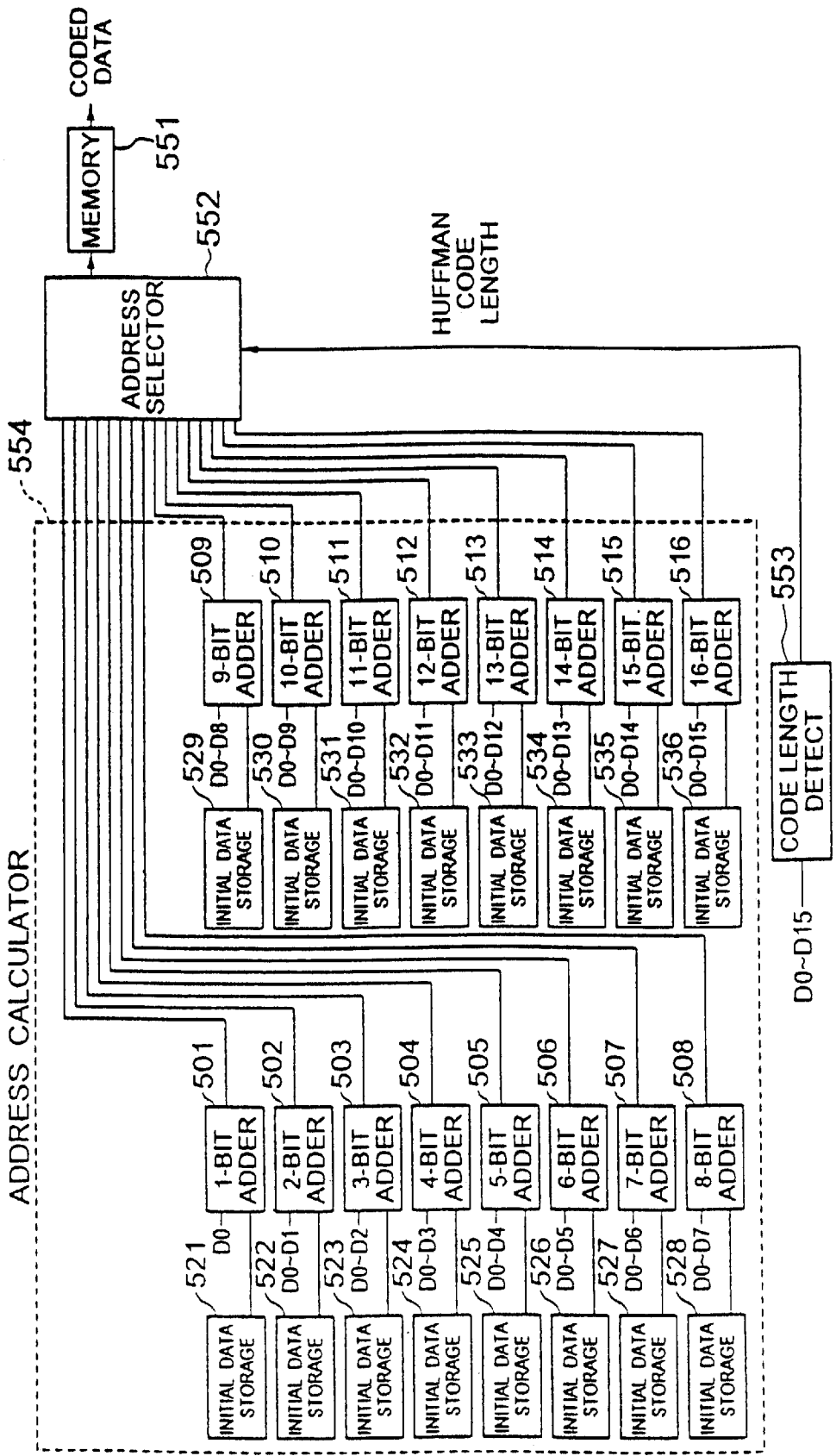
FIG. 3 is a block diagram of another conventional Huffman-code code decoder.
Figure 4:
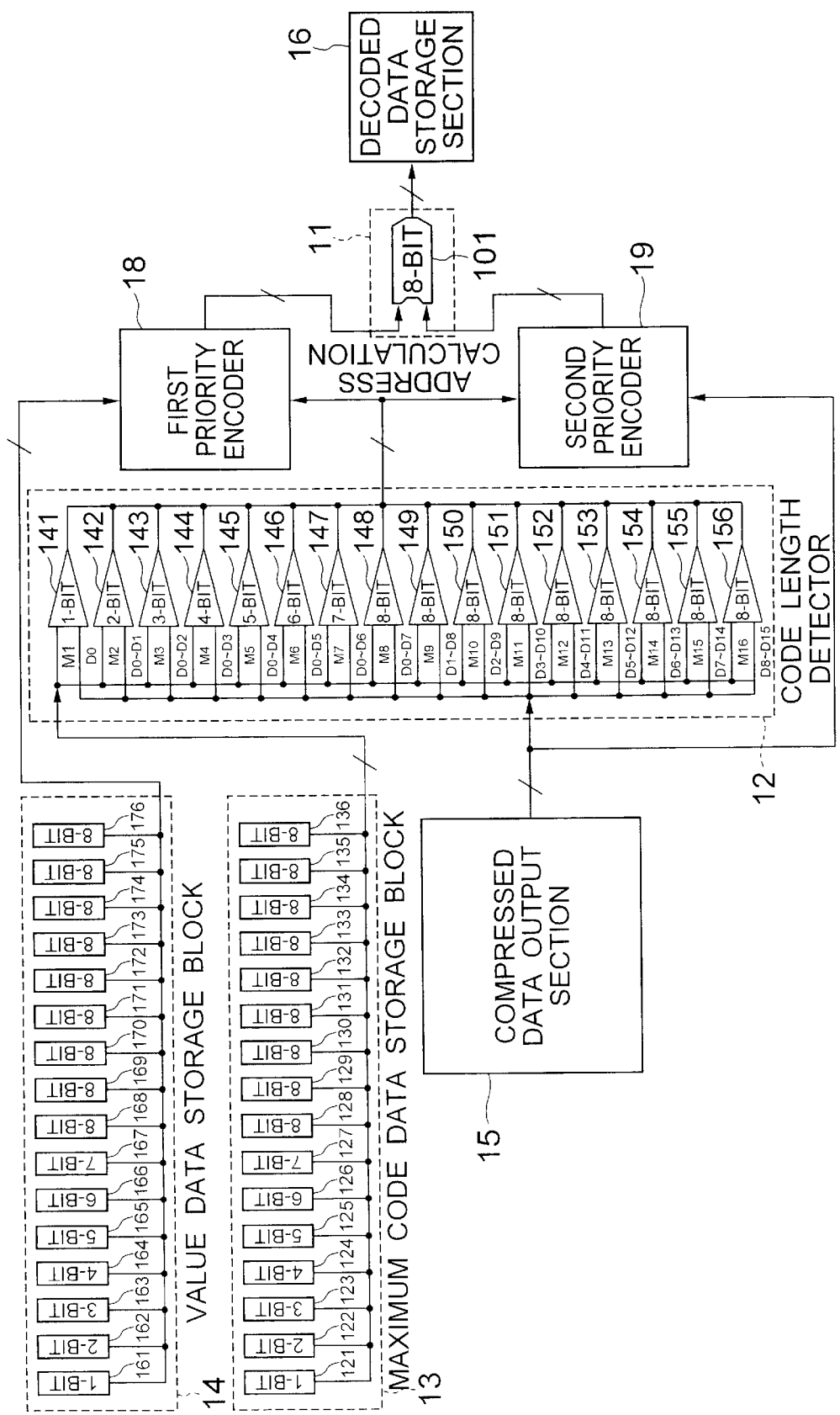
FIG. 4 is a block diagram of a Huffman-code decoder according to an embodiment of the present invention.

Referring to FIG. 4, a Huffman-code decoder according to an embodiment of the present invention includes a maximum code data storage section 13, a value data storage section 14, a code length detector 12, a first priority encoder 18, a second priority encoder 19, an address calculator 11, a compressed data output section 15, and a decoded data storage section 16.

The maximum code data storage section 13 includes sixteen maximum code data memories including a 1-bit memory 121 for storing the maximum code (M1) among the Huffman codes each having a single bit (D0), a 2-bit memory 122 for storing the maximum code (M2) among the Huffman codes each having two bits (D0, D1), a 3-bit memory 123 for storing the maximum code (M3) among the Huffman codes each having three bits (D0, D1, D2), and a 7-bit memory 167 for storing the maximum code (M7) among the Huffman codes each having seven bits (D0, D1 . . . D6).

The maximum code data storage section 13 also includes a first 8-bit memory 128 for storing the maximum code (M8) among the Huffman codes each having eight-bits (D0, D1 . . . D7), a second 8-bit memory 129 for storing least significant eight bits (D1, D2 . . . D8) of the maximum code (M9) among the Huffman codes each having nine bits (D0, D1 . . . D8), a third 8-bit memory 130 for storing least significant eight bits (D2, D3 . . . D9) of the maximum code (M10) among the Huffman codes each having ten bits (D0, D1 . . . D9), and a ninth 8-bit memory for storing least significant eight bits (D8, D9 . . . D15) of the maximum code (M16) among the Huffman codes each having sixteen bits (D0, D1 . . . D15). In FIG. 4, the maximum code data having least significant eight bits of the maximum code among the Huffman codes having "n" code length is also denoted by "Mn" for the sake of convenience.

The maximum code data storage section 13 delivers the maximum code data M1, M2, and M16 via one hundred data lines to the code length detector 12, the number "one hundred" being obtained by a simple calculation (9×8+7+6+5+4+3+2+1).

The compressed data output section 15 delivers first bit D0 through sixteenth bit D15 of the input Huffman code in the compressed data via sixteen data lines to the code length detector 12 and the second encoder 19.

The value data storage section 14 includes value data memories 161 to 176 in number corresponding to the number of maximum code memories 121 to 136. Each value data memory stores a value data obtained by subtraction of the address of the minimum code among the Huffman codes each having a specified code length from the minimum code data. The minimum code data include minimum codes for the code lengths which are less than nine, and least significant eight bits of the minimum codes for the code lengths equal to or above nine. The address of the minimum code, if input to the decoded data storage section 16, specifies the minimum code in the decoded data storage section 16.

More specifically, a 1-bit value data storage section 161 stores 1-bit value data obtained from the Huffman codes each having a single bit, a 2-bit value data 162 memory stores 2-bit value data obtained from the Huffman codes each having two bits, a 7-bit value data storage section 167 stores value data obtained from the Huffman codes each having seven bits, a first 8-bit value data storage section 168 stores 8-bit value data obtained from the Huffman codes each having eight bits, a second 8-bit value data storage section 169 stores 8-bit value data obtained from the Huffman codes each having nine bits, and a sixteenth 8-bit value data storage section 176 stores 8-bit value data obtained from the Huffman codes each having sixteen bits. The value data storage section 14 delivers the value data via hundred data lines to the data inputs of the first priority encoder 18.

The code length detector 12 includes comparators 141 to 156 in number corresponding to the number of memories 121 to 136 in the maximum code data storage section 13, and each comparator has bits in number corresponding to the number of bits of a corresponding one of memories 121 to 136. A 1-bit comparator 141 in the code length detector 12 compares the first bit D0 of the input Huffman code supplied from the compressed data output section 15 against the maximum code M1 stored in the 1-bit memory 121 to output a high or low level based on the result of the comparison. Similarly, each of the n-bit comparators 142 to 147 (1<n<8) and the first 8-bit comparator 148 compares the corresponding number of bits of the input Huffman code against the data stored in a corresponding one of the memories 122 to 128 in the maximum code data storage section 13 to output the result of the comparison. Each of the second through ninth 8-bit comparators 149 to 156 compares the least significant eight bits of the input Huffman code against the data stored in a corresponding one of the memories 129 to 136 to output the result of the comparison.

For example, it is assumed that the compressed data output section 15 delivers a specific 9-bit Huffman code "111110110", wherein the leftmost bit (D0) is the most significant bit. In this case, the first 8-bit comparator 148 compares the most significant bits (D0 to D7) "11111011"

among the nine bits of the input Huffman code against the maximum code "M8=11111010" stored in the memory 128, thereby outputting a high level signal due to the higher level of the former compared to the latter. On the other hand, also in this case, the second 8-bit comparator 149 compares the least significant eight bits (D1 to D8) "11110110" among the nine bits of the input Huffman code against the corresponding bits of the maximum code "M9=11111101" stored in the corresponding memory 129, thereby outputting a low level signal due to the lower level of the former compared to the latter.

In the case as described above, wherein input Huffman code "111110110" having nine bits is input, the 1-bit comparator 141 to 7-bit comparator 147 as well as the first 8-bit comparator 148 deliver high level signals, whereas the second to ninth 8-bit comparators 149 to 156 deliver low level signals. Thus, the priority encoders 18 and 19, which monitor the output levels of the comparators 141 to 156, determine that the input Huffman code has nine bits after detecting which two adjacent comparators deliver different levels.

The first priority encoder 18 thus determines the code length of the input Huffman code based on the outputs of the code length detector 12, and selects one of the outputs corresponding to the code length supplied from the value data storage section 14. The first priority encoder 18 delivers the selected value data to the address calculator 11 as a subtrahend. The second priority encoder 19 also determines the code length of the input Huffman code based on the outputs of the code length detector 12, and delivers eight bits out of the nine bits of the input Huffman code to the address calculator 11 as a minuend.

The address calculator 11 is implemented as a 8-bit subtracter, which subtracts the value data supplied from the value data storage section 14 from the input Huffman code or the least significant eight bits of the input Huffman code supplied from the compressed data output section 15. The address calculator 11 delivers the remainder to the decoded data storage section as an address signal. The decoded data storage section 16 stores the decoded data for the input Huffman code at the address specified by the address calculator 11, and delivers the decoded output.

Figure 5:
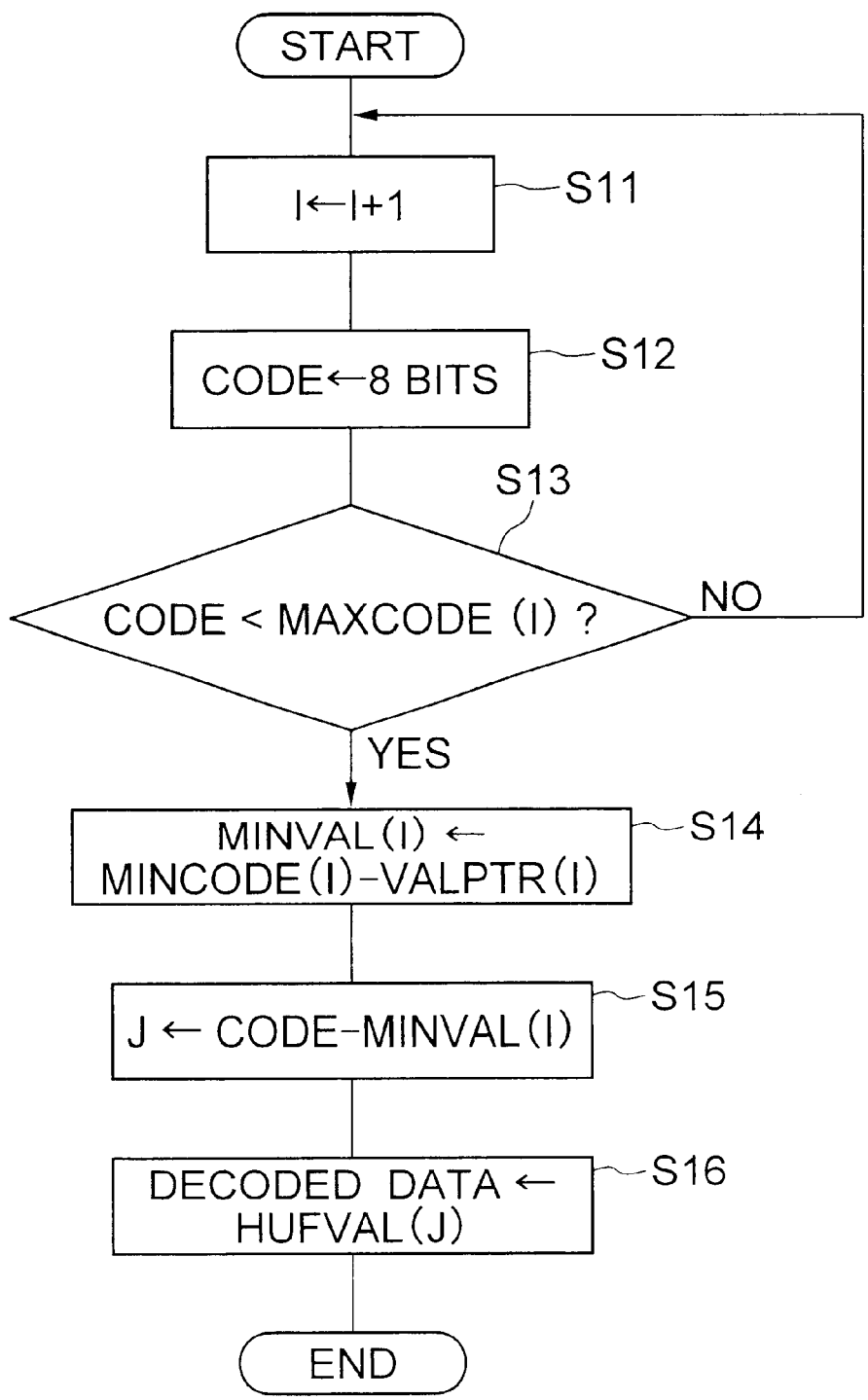
FIG. 5 is a flowchart of operation of a typical Huffman-code decoder using a principle of the present invention.

The principle of the present invention is more specifically described with reference tp to FIG. 5 showing a typical process for decoding the Huffman code using the principle of the present invention.

Before operation of the Huffman-code decoder of the principle of the present invention, the possible number (J) of Huffman codes having a single bit to sixteen bits are sorted in an ascending order and stored in the decoded data storage section 16. The decoded data can be accessed simply by inputting the address of the decoded data, which is equal to the sequential order of the decoded data. Then, minimum array variable MINCODE(I), maximum array variable MAXCODE(I), address variable VALPTR(I) and decoded variable HUFVAL(J) are defined. The minimum array variable "MINCODE(I) represents the minimum code of the Huffman codes having "I" bits ($1 \leq I \leq 8$), and represents least significant bit of the minimum code of the Huffman codes having "I" bit ($9 \leq I \leq 16$)), the maximum array variable MAXCODE(I) represents maximum code of the Huffman codes having "I" bits ($1 \leq I \leq 8$), and represents least significant bits of the maximum code of the Huffman codes having "I" bits ($9 \leq I \leq 16$).

The address variable VALPTR(I) represents the address or sequential order of the sorted Huffman code in the coded data storage section 16. The decoded array variable HUFVAL(J) represents the decoded data for all the sorted Huffman codes.

The process starts with the number "I" of bits being set at zero for the input Huffman code. After incrementing the number "I" by one in step S11, eight bits or less number of bits are selected among all the bits of the input Huffman code in step S12 for defining "CODE", which represents the input Huffman code. More specifically, if the number of bits is between one and seven, then the first bit to I-th bit are selected. If the number of bits is equal to or above eight, then (I-8)th bit to I-th bit are selected. Thus, "CODE" stores the selected bits of the input Huffman code in step S12.

It is examined in step S13 whether "CODE" is less than MAXCODE(I). If "CODE" is not less than MAXCODE(I), then the process returns to step S11, and if "CODE" is less than MAXCODE(I), then the process advances to step S14, wherein variable MINVAL(I) is set at a value obtained by subtracting VALPTR(I) from MINCODE(I). Then, the process advances to step S15, wherein MINVAL(I) is extracted from "CODE" to obtain the decoded address "J" of the input Huffman code, followed by decoding the array variable HUFVAL(J) based on the address "J" to obtain decoded data for the input Huffman code in step S16.

In the above principle. The following equation is used.

$$J=\text{CODE}(I)-\text{MINVAL}(I)=\text{CODE}(I)-(\text{MINCODE}(I)-\text{VALPTR}(I))=(\text{CODE}(I)-\text{MINCODE}(I))+\text{VALPTR}(I)$$

In short, the decoded data for an input Huffman code can be obtained by the address (J) thereof, which is calculated based on the address VALPTR(I) of the minimum code among the Huffman codes having the same code length and the sequential number of the input Huffman code counted from the minimum code.

In the embodiment of FIG. 4, the steps S11 to S13 are conducted at once in respective comparators 141 to 156 in the code length detector 12, thereby operating at a higher speed.

In the above embodiment, since the variables MINCODE(I) and VALPTR(I) are known for the possible Huffman codes, the remainders of MINCODE(I)−VALPTR(I) for possible "Is" are stored in the value data storage section 14 as a variable MINVAL(I). The MINVAL(I) can be accessed by the cord length of the input Huffman code. Thus, the step of subtraction is omitted by reading the value data from the value data storage section 14.

In the base line system defined in the International Standard "JPEG", the possible number of remainders of MINCODE(I)−VALPTR(I) is 162 at most and thus can be represented by 8-bit addresses. This enables the Huffman codes having nine or more bits to be processed in an 8-bit processing component, thereby reducing the circuit scale of the Huffman-code decoder of the present embodiment compared to the conventional decoder.

Since the above embodiments are described only for examples, the present invention is not limited to the above embodiments and various modifications or alterations can be easily made therefrom by those skilled in the art without departing from the scope of the present invention.

What is claimed is:

1. A Huffman-code decoder comprising:
   a coded data memory for storing coded data for possible Huffman codes, the coded data having addresses defined by sequential numbers of said Huffman codes, a number of said possible Huffman codes being equal to or less than $2_N$, said possible Huffman codes having M bits at most;
   a maximum code data storage section including a plurality of memory cells each for storing a maximum code data;

a value data storage section including a plurality of memories each for storing value data corresponding to minimum code among Huffman codes having a corresponding number of bits;

a code length detector for detecting a code length of an input Huffman code by comparing the input Huffman code against the maximum code data;

a first selection section for selecting, based on the code length detected by said code length detector, all bits of the input Huffman codes having (N−1) bits or less, and (n-N+1)th bit to n-th bit of the input Huffman code having N bits or more, "n" being a natural number assuming N to M;

a second selection section for selecting one of maximum code data, stored in said maximum code data storage section, based on the code length detected by said code length detector; and an address calculator for calculating an address based on the selected bits of the input Huffman code and the selected value data to specify the coded data in said coded data storage section based on the calculated address, each said value data corresponding to a remainder obtained by subtracting the address of a minimum code among Huffman codes having a corresponding number of bits in said coded data storage section from minimum code data, said minimum code data corresponding to the minimum code among Huffman codes having (N−1) bits or less and corresponding to (n-N+1)th bit to n-th bit of a minimum code among Huffman codes having N bits or more.

2. The Huffman-code decoder as defined in claim 1, wherein said maximum code data corresponds to a maximum code among Huffman codes having (N−1) bits or less and corresponding to (n-N+1)th bit to n-th bit of a maximum code among Huffman codes having N bits or more, and said first selection section selects for selecting all bits of the input Huffman codes having (N−1) bits or less and (n-N+1)th bit to n-th bit of the input Huffman code having N bits or more based on the detected code length.

3. The Huffman-code decoder as defined in claim 1, wherein said address calculator is a subtracter.

* * * * *